(12) United States Patent  
Li et al.

(10) Patent No.: US 9,245,648 B1
(45) Date of Patent: Jan. 26, 2016

(54) LOGIC HIGH-DIELECTRIC-CONSTANT (HK) METAL-GATE (MG) ONE-TIME-PROGRAMMING (OTP) MEMORY DEVICE SENSING METHOD

(71) Applicant: QUALCOMM Incorporated, San Diego, CA (US)

(72) Inventors: Xia Li, San Diego, CA (US); Xiaonan Chen, San Diego, CA (US); Xiao Lu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/498,519

(22) Filed: Sep. 26, 2014

(51) Int. Cl.  
*G11C 17/00* (2006.01)  
*G11C 17/18* (2006.01)  
*G11C 17/16* (2006.01)

(52) U.S. Cl.  
CPC .............. *G11C 17/18* (2013.01); *G11C 17/16* (2013.01)

(58) Field of Classification Search  
CPC ..... G11C 17/16; G11C 17/18; H01L 23/5252  
USPC ........................................ 365/96, 149, 225.7  
IPC ................... G11C 17/16, 17/18; H01L 23/5252  
See application file for complete search history.

(56) References Cited

U.S. PATENT DOCUMENTS

| 6,108,261 | A | * | 8/2000 | Kim | ..................... G11C 17/18 365/200 |
|---|---|---|---|---|---|
| 6,700,151 | B2 | | 3/2004 | Peng | |
| 7,307,880 | B2 | | 12/2007 | Ko et al. | |
| 7,808,054 | B2 | * | 10/2010 | Wada | ..................... G11C 17/16 257/379 |
| 2012/0099361 | A1 | * | 4/2012 | Lin | ..................... G11C 17/04 365/102 |
| 2012/0314474 | A1 | | 12/2012 | Chen et al. | |
| 2013/0148404 | A1 | | 6/2013 | Bandyopadhyay et al. | |
| 2013/0208525 | A1 | | 8/2013 | Peng et al. | |

* cited by examiner

*Primary Examiner* — Connie Yoha  
(74) *Attorney, Agent, or Firm* — Muncy, Geissler, Olds & Lowe, P.C.

(57) ABSTRACT

In a one-time-programming (OTP) memory cell, dual-voltage sensing is utilized to determine whether the memory cell has experienced a non/soft breakdown or a hard breakdown. The drain current of the memory cell is read when the gate voltage is at a first predetermined voltage, and if the read drain current is greater than a predetermined current level, then a hard breakdown is detected. One or more additional readings of the current may be obtained to determine that a hard breakdown has occurred. If the read drain current is less than the predetermined current level, then a non/soft breakdown is detected. The threshold voltage of the memory cell may be shifted, and a second reading of the drain current may be obtained when the gate voltage is at a second predetermined voltage in case the memory cell experiences a non/soft breakdown.

30 Claims, 7 Drawing Sheets

US 9,245,648 B1

LOGIC HIGH-DIELECTRIC-CONSTANT (HK) METAL-GATE (MG) ONE-TIME-PROGRAMMING (OTP) MEMORY DEVICE SENSING METHOD

FIELD OF DISCLOSURE

Various embodiments described herein relate to high-dielectric-constant (HK) metal-gate (MG) one-time-programming (OTP) memory devices, and more particularly, to apparatus and method of sensing hard or soft or non-breakdowns of HK-MG OTP memory devices.

BACKGROUND

High-dielectric-constant (HK) metal-gate (MG) one-time-programming (OTP) memory devices with thin gate dielectric layers have been used as logic devices in semiconductor integrated circuits. A typical logic HK-MG OTP memory device may experience a non-breakdown or soft breakdown or a hard breakdown. Non-breakdowns or soft breakdowns (non/soft breakdowns) and hard breakdowns typically have different sensing spots and windows for typical logic HK-MG OTP memory devices. When the gate dielectric of a logic HK-MG OTP memory device becomes thinner, soft breakdowns are more likely to occur than hard breakdowns. In a soft breakdown, which may occur more frequently than a hard breakdown in a logic HK-MG OTP memory device with a thin gate dielectric layer, the gate maintains control to the channel. A close soft breakdown is a case in which the gate still maintains control to the channel but is close to a hard breakdown. Non-breakdown is similar to the case of soft breakdown but there is no gate leakage jump and gate can fully control channel with shifted threshold voltage. In contrast, when a hard breakdown or a close hard breakdown occurs, the gate loses control to the channel. There exists a need for reliably detecting soft breakdowns, close soft breakdowns and hard breakdowns in logic HK-MG OTP memory devices with thin gate dielectric layers.

SUMMARY

Exemplary embodiments are directed to sensing of non-breakdown/soft breakdowns and hard breakdowns in memory cells, for example, P-channel metal-oxide-semiconductor (PMOS) high-dielectric-constant (HK) metal-gate (MP) one-time-programming (OTP) memory cells.

In an embodiment, a method of sensing a soft breakdown/non-breakdown and a hard breakdown in a memory cell is provided, the method comprising: reading a first drain current at a first gate voltage; comparing the first drain current to a predetermined drain current; based upon a determination that the first drain current is greater than or equal to the predetermined drain current, outputting a reading of the first drain current; and generating an indication that the memory cell has a hard breakdown; based upon a determination that the first drain current is less than the predetermined drain current, reading a second drain current at a second gate voltage; outputting a reading of the second drain current; and generating an indication that the memory has a soft breakdown/non-breakdown.

In another embodiment, a method for sensing a soft breakdown/non-breakdown and a hard breakdown in a memory cell is provided, the method comprising the steps for: reading a first drain current at a first gate voltage; comparing the first drain current to a predetermined drain current; based upon a determination that the first drain current is greater than or equal to the predetermined drain current, performing the steps for: outputting a reading of the first drain current; and generating an indication that the memory cell has a hard breakdown; based upon a determination that the first drain current is less than the predetermined drain current, performing the steps for: reading a second drain current at a second gate voltage; outputting a reading of the second drain current; and generating an indication that the memory has a soft breakdown/non-breakdown.

In another embodiment, an apparatus for sensing a soft breakdown/non-breakdown and a hard breakdown in a memory cell is provided, the apparatus comprising: means for reading a first drain current at a first gate voltage; means for comparing the first drain current to a predetermined drain current; means for outputting a reading of the first drain current; means for generating an indication that the memory cell has a hard breakdown based upon a determination that the first drain current is greater than or equal to the predetermined drain current; means for reading a second drain current at a second gate voltage; means for outputting a reading of the second drain current; and means for generating an indication that the memory has a soft breakdown/non-breakdown based upon a determination that the first drain current is less than the predetermined drain current.

In yet another embodiment, an apparatus configured to perform operations to sense a soft breakdown/non-breakdown and a hard breakdown in a memory cell, the apparatus comprising: a memory; and a processor for executing a set of instructions stored in the memory, the set of instructions comprising instructions to: read a first drain current at a first gate voltage; compare the first drain current to a predetermined drain current; based upon a determination that the first drain current is greater than or equal to the predetermined drain current, output a reading of the first drain current; and generate an indication that the memory cell has a hard breakdown; based upon a determination that the first drain current is less than the predetermined drain current, read a second drain current at a second gate voltage; output a reading of the second drain current; and generate an indication that the memory has a soft breakdown/non-breakdown.

BRIEF DESCRIPTION OF THE DRAWINGS

The accompanying drawings are presented to aid in the description of embodiments of the disclosure and are provided solely for illustration of the embodiments and not limitations thereof.

DETAILED DESCRIPTION

Figure 1A:
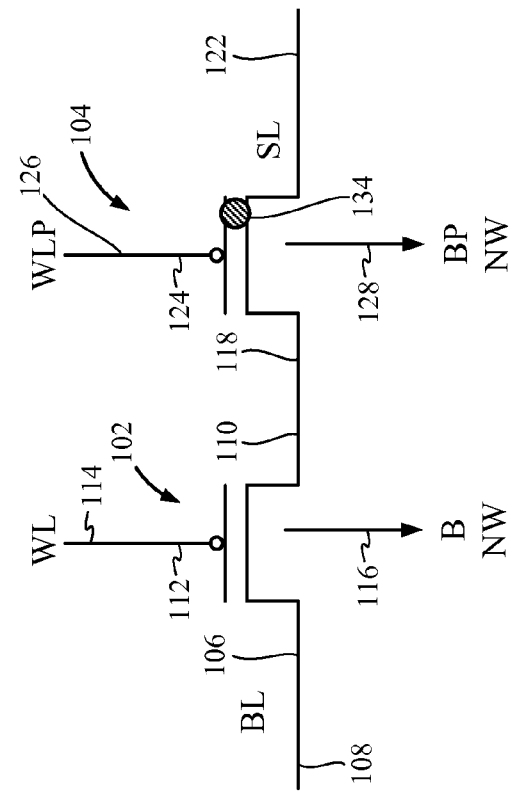
FIGS. 1A and 1B are circuit diagrams illustrating an embodiment of a PMOS HK-MG OTP memory cell in a pre-program mode and a post-program mode, respectively.

Aspects of the disclosure are described in the following description and related drawings directed to specific embodiments. Alternate embodiments may be devised without departing from the scope of the disclosure. Additionally, well known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an," and "the," are intended to include the plural forms as well, unless the context clearly indicates otherwise. It will be further understood that the terms "comprises," "comprising," "includes," or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise.

Furthermore, many embodiments are described in terms of sequences of actions to be performed by, for example, elements of a computing device. It will be recognized that various actions described herein can be performed by specific circuits, such as application specific integrated circuits (ASICs), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments of the disclosure are described with respect to memory cells, such as one-time-programming (OTP) memory cells. Such OTP memory cells may be metal-gate (MG) OTP memory cells, for example, high-dielectric-constant (HK) MG OTP memory cells. It also can be a poly gate and oxide gate, i.e., poly/SiON MOS OTP memory cells. Specific embodiments of the disclosure are described with respect to P-channel metal-oxide-semiconductor (PMOS) OTP memory cells, for example, 16 FinFET (16FF) PMOS OTP memory cells. It will be understood by persons skilled in the art, however, that the principles disclosed herein are also applicable to other types of devices.

Figure 1B:
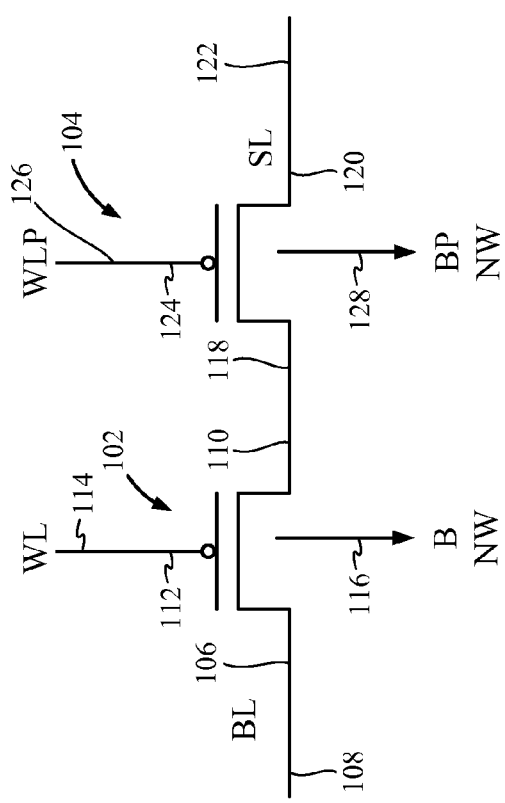

FIGS. 1A and 1B are circuit diagrams illustrating an embodiment of a PMOS OTP memory cell in a pre-program mode and a post-program mode, respectively, in which the method of sensing soft breakdowns/non-breakdowns and hard breakdowns are applicable according to embodiments of the disclosure. In FIG. 1A, the PMOS OTP memory cell comprises a first transistor 102 and a second transistor 104. The first transistor 102 has a drain 106 connected to a bit line (BL) 108, a source 110, and a gate 112 connected to a word line (WL) 114. The first transistor also has a body N-well (B NW) 116. The second transistor 104 has a drain 118 connected to the source 110 of the first transistor 102, a source 120 connected to a source line (SL) 122, and a gate 124 connected to a word line program (WLP) line 126. The second transistor 104 also has a body program N-well (BP NW) 128.

In an embodiment, the first transistor 102 and the second transistor 104 indicate pre-program state before the memory cell is programmed, that is when the memory cell is in the pre-program mode. In an embodiment, after the second transistor 104 is programmed, that is, when it is in the post-program mode, the charge trap 134 of the second transistor 104 is caused VT shift+300 mV in FIG. 1B. After the charge trap of the second transistor 104 is set up as indicated by the dot 134 in FIG. 1B after programming, it cannot be removed by a reverse voltage due to its one-time programming effect.

Figure 2:
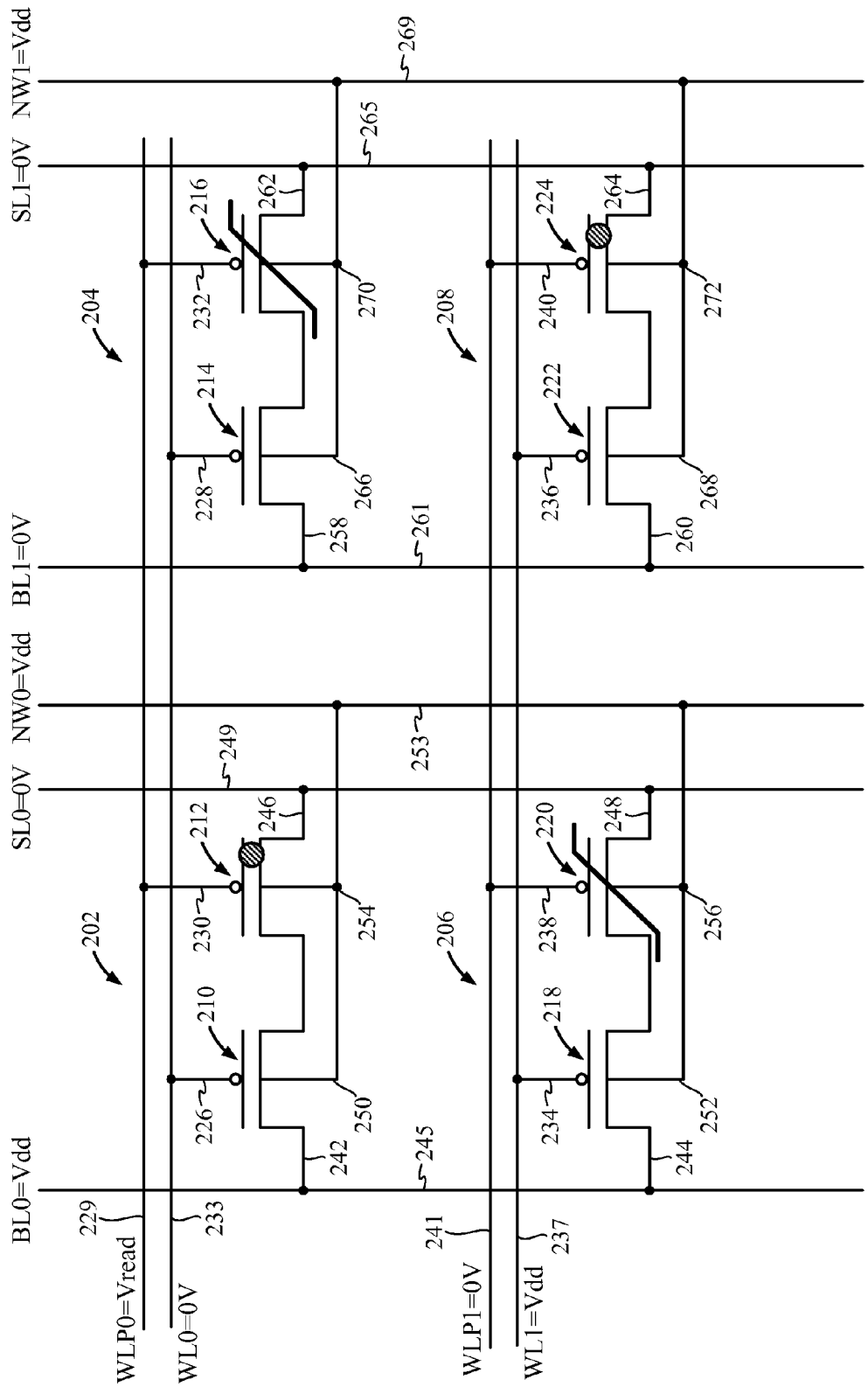
FIG. 2 is a circuit diagram illustrating an embodiment of a 2×2 OTP memory array comprising four sets of two-transistor OTP memory cells as illustrated in FIGS. 1A and 1B.

FIG. 2 is a circuit diagram illustrating an embodiment of an OTP memory array comprising four sets of two-transistor OTP memory cells as illustrated in FIGS. 1A and 1B. In the embodiment shown in FIG. 2, four OTP memory cells 202, 204, 206 and 208 are provided in a 2×2 array, in which the OTP memory cells 202 and 208 are in the post-program mode and the OTP memory cells 204 and 206 are in the pre-program mode. In an embodiment, the first OTP memory cell 202 comprises two PMOS transistors 210 and 212, the second OTP memory cell 204 comprises two PMOS transistors 214 and 216, the third OTP memory cell 206 comprises two PMOS transistors 218 and 220, and the fourth OTP memory cell 208 comprises two PMOS transistors 222 and 224.

In an embodiment, the gates 226 and 228 of the PMOS transistors 210 and 214 in the first and second OTP memory cells 202 and 204, respectively, are both connected to a word line "WL0" 233, which is set at 0V. In a further embodiment, the gates 230 and 232 of the PMOS transistors 212 and 216 in the first and second OTP memory cells 202 and 204, respectively, are both connected to a word line programming line "WLP0" 229, to which a reading voltage ($V_{read}$) is applied, as described in further detail below. In the embodiment shown in FIG. 2, the second PMOS transistor 212 in the first OTP memory cell 202 is used for sensing Vt shift for non/soft and hard breakdowns, although other PMOS transistors in other memory cells in the memory array may also be used for sensing VT shift for non/soft and hard breakdowns in a similar manner.

In an embodiment, the gates 234 and 236 of the PMOS transistors 218 and 222 in the third and fourth OTP memory cells 206 and 208, respectively, are both connected to a word line "WL1" 237, which is applied a power supply drain voltage ($V_{dd}$). In a further embodiment, the gates 238 and 240 of the PMOS transistors 220 and 224 in the third and fourth OTP memory cells 206 and 208, respectively, are both connected to a word line programming line "WLP1" 241, which is set at 0V.

In an embodiment, the drains 242 and 244 of the PMOS transistors 210 and 218 in the first and third OTP memory cells 202 and 206, respectively, are both connected to a bit line "BL0" 245, which is applied a power supply drain voltage ($V_{dd}$). In an embodiment, the sources 246 and 248 of the PMOS transistors 212 and 220 in the first and third OTP memory cells 202 and 206, respectively, are both connected to a source line "SL0" 249, which is set at 0V.

In an embodiment, the body N-wells 250 and 252 of the PMOS transistors 210 and 218 in the first and third OTP memory cells 202 and 206, respectively, are both connected to an N-well line "NW0" 253, which is applied a power supply drain voltage ($V_{dd}$). In a further embodiment, the body program N-wells 254 and 256 of the PMOS transistors 212 and 220 in the first and third OTP memory cells 202 and 206, respectively, are also both connected to the N-well line "NW0" 253.

In an embodiment, the drains 258 and 260 of the PMOS transistors 214 and 222 in the second and fourth OTP memory cells 204 and 208, respectively, are both connected to a bit line "BL1" 261, which is set at 0V. In an embodiment, the sources 262 and 264 of the PMOS transistors 216 and 224 in the second and fourth OTP memory cells 204 and 208, respectively, are both connected to a source line "SL1" 265, which is also set at 0V.

In an embodiment, the body N-wells 266 and 268 of the PMOS transistors 214 and 222 in the second and fourth OTP memory cells 204 and 208, respectively, are both connected to an N-well line "NW1" 269, which is applied a power supply drain voltage ($V_{dd}$). In a further embodiment, the body program N-wells 270 and 272 of the PMOS transistors 216 and 224 in the second and fourth OTP memory cells 204 and 208, respectively, are also both connected to the N-well line "NW1" 269.

Figure 3:
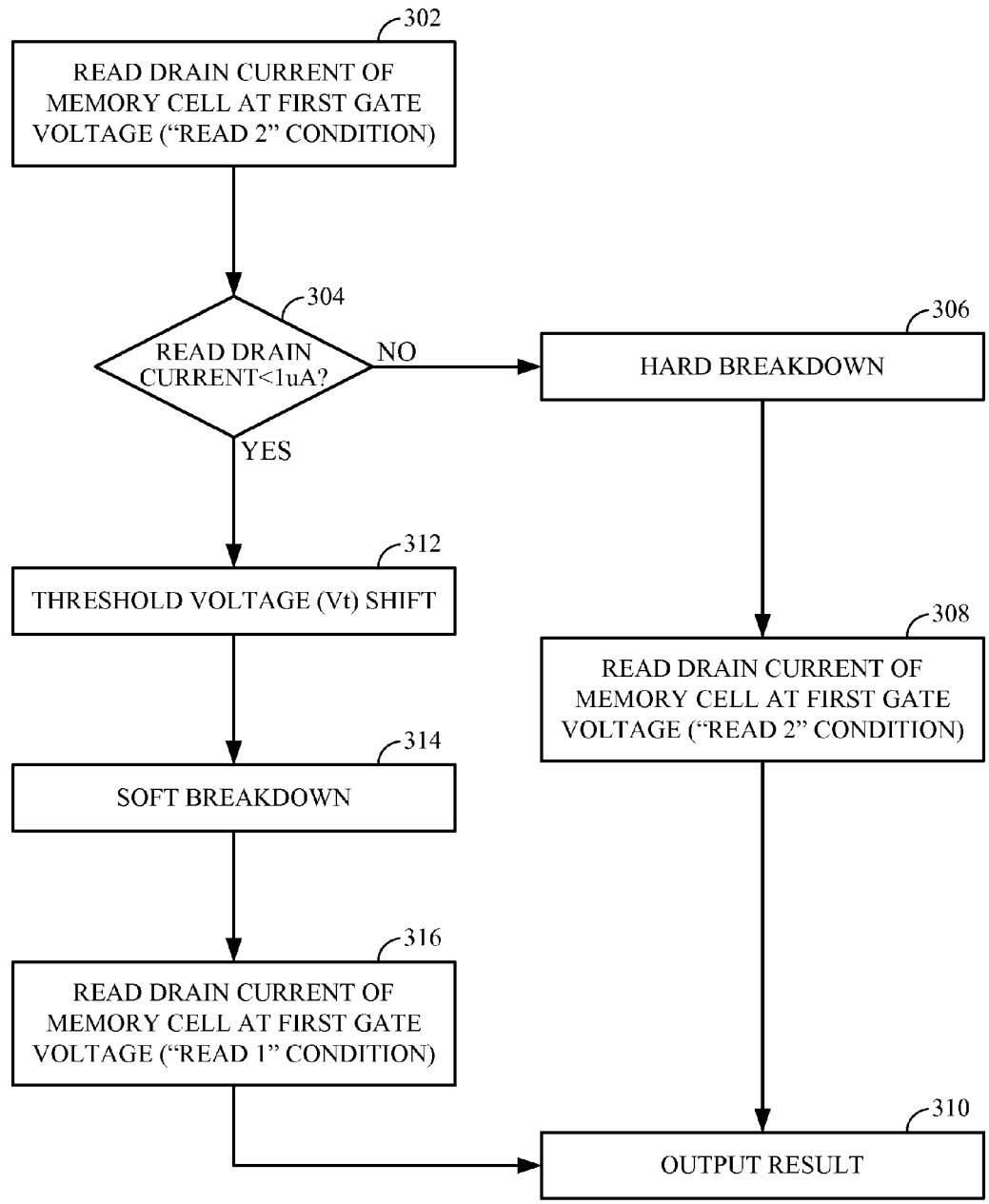
FIG. 3 is a flowchart illustrating an embodiment of a method for sensing soft and hard breakdowns in an OTP memory cell.

FIG. 3 is a flowchart illustrating an embodiment of a method for sensing OTP Vt shift with non/soft and hard breakdowns in a memory cell, such as a 16FF PMOS HK-MG OTP memory cell. While the flowchart of FIG. 3 illustrates some of the process steps for sensing OTP device with non/soft and hard breakdowns in a memory cell, the sensing operations will be described in further detail with respect to exemplary cases of non/soft and hard breakdowns with respect to the graphs as shown in FIGS. 4-7, which illustrate forward and reverse drain currents ($I_d$) versus gate voltage ($V_g$) curves in those exemplary cases.

Referring to FIG. 3, a first drain current ($I_d$) of the memory cell is read when a first gate voltage is applied to the gate of the PMOS transistor in step 302. In an embodiment, the first gate voltage may be a first predetermined voltage applied to the gate of the PMOS OTP transistor for sensing OTP device with non/soft and hard breakdowns. For example, the first gate voltage may be applied as a read voltage ($V_{read}$) to the gate 230 of the second PMOS transistor 212 in the first OTP memory cell 202 through the WLP0 line 229 in FIG. 2. In an embodiment, the first gate voltage is set at a predetermined voltage level, for example, 0.9V for a PMOS device, when the memory cell is in a "read 2" condition, which will be described in further detail with respect to graphs of $I_d$-$V_g$ curves in FIGS. 4-7.

Referring to FIG. 3, after the first drain current ($I_d$) of the memory cell is read when the first gate voltage is applied, the drain current based on the first reading of the memory cell in the "read 2" condition is compared to a predetermined current level, for example, 1 μA, as shown in step 304. If the drain current is less than 1 μA, then the memory cell is in a non/soft breakdown. If the drain current is greater than or equal to 1 μA, then the memory cell in a hard breakdown. Upon determining that the drain current is greater than or equal to 1 μA in step 304, the memory cell is deemed to have experienced a hard breakdown as shown in step 306. In an embodiment, the reading of the drain current may be output as a hard breakdown drain current for the memory cell.

In an embodiment, the drain current of the memory cell is read again when the first gate voltage is applied again in the "read 2" condition in step 308 to ensure that the memory cell has indeed experienced a hard breakdown. In an embodiment, the second reading may replace the first reading of the drain current as a hard breakdown current for the memory cell. In a further embodiment, multiple readings of the drain current may be obtained in the "read 2" condition before it is determined the memory cell has an experienced a hard breakdown. In an embodiment, the reading of the drain current of the memory cell may be output in step 310, and an indication that the memory cell has experienced a hard breakdown may also be generated and output in step 310.

Upon determining that the drain current is less than 1 μA in step 304, the threshold voltage ($V_t$) of the memory cell is shifted in an embodiment as shown in step 312, and the memory cell is deemed to have experienced a non/soft breakdown as shown in step 314. In an embodiment, the drain current ($I_d$) of the memory cell is read again when a second gate voltage is applied to the gate of the PMOS transistor in step 316. In an embodiment, the second gate voltage may be a second predetermined voltage applied to the gate of the PMOS transistor, such as the second PMOS transistor 212 in the first OTP memory cell 202 in FIG. 2.

In an embodiment, the second gate voltage may be applied as a read voltage ($V_{read}$) to the gate 230 of the second PMOS transistor 212 in the first OTP memory cell 202 through the WLP0 line 229 in FIG. 2. In an embodiment, the second gate voltage is set at a predetermined voltage level, for example, 0.4V for a PMOS device, when the memory cell is in a "read 1" condition, which will be described in further detail with respect to graphs of $I_d$-$V_g$ curves in FIGS. 4-7. Referring to FIG. 3, the reading of the drain current of the memory cell in the "read 1" condition may be output in an embodiment as shown in step 310, and an indication that the memory cell has experienced a non/soft breakdown with a Vt shift may also be generated and output in step 310.

Figure 4:
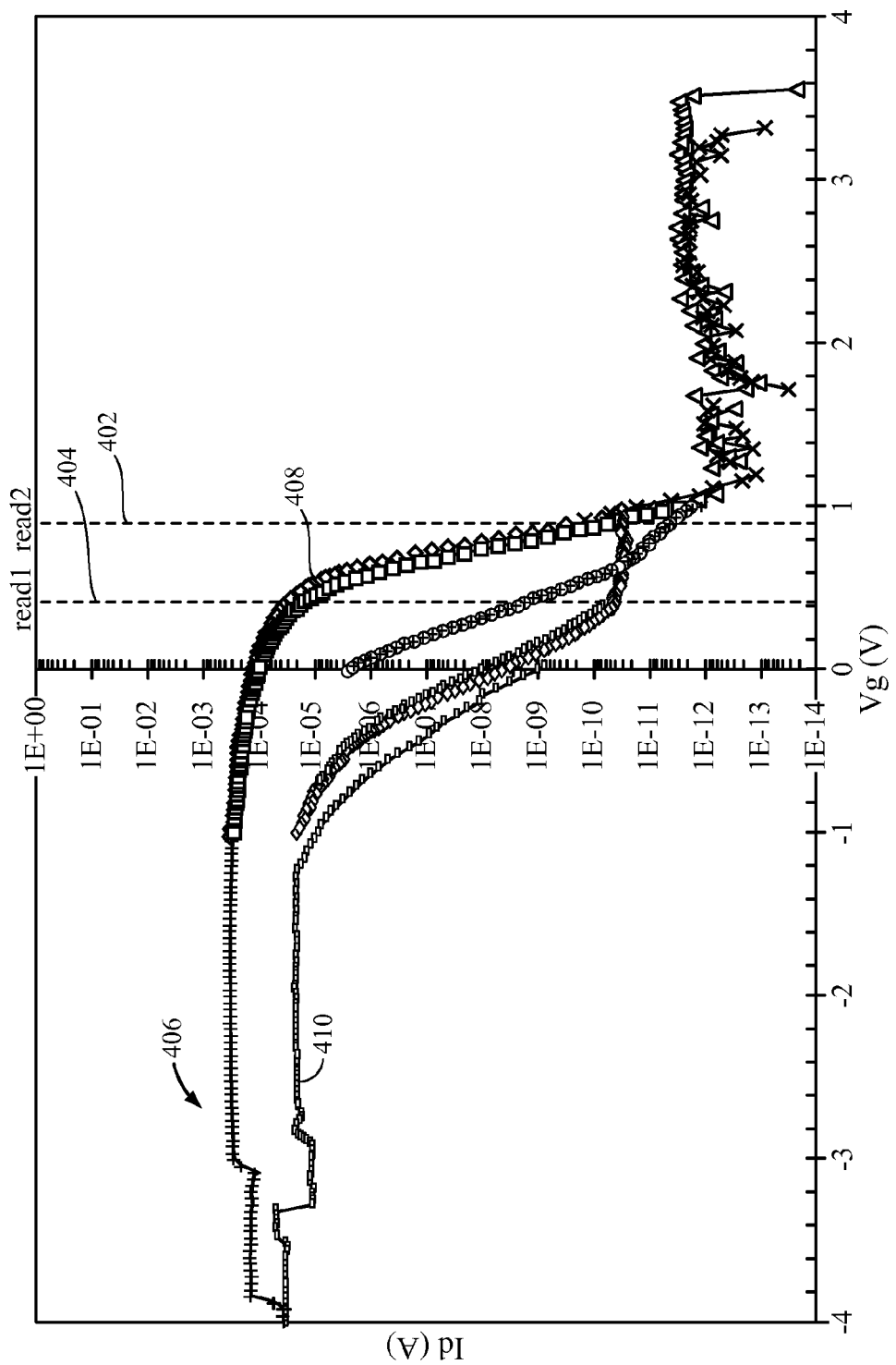
FIG. 4 is a graph illustrating an example of drain current versus gate voltage ($I_d$-$V_g$) curves in which an OTP memory cell experiences a soft breakdown.

FIG. 4 is a graph illustrating an example of drain current versus gate voltage ($I_d$-$V_g$) curves in an exemplary case in which a 16FF PMOS HK-MG OTP memory cell experiences a soft breakdown. In FIG. 4, the x-axis or abscissa is the gate voltage ($V_g$) from −4V to +4V on a linear scale, while the y-axis or ordinate is the drain current ($I_d$) in the range of $10^{-14}$ A to 1A on a logarithmic scale. In a PMOS OTP memory cell, the drain current is approximately equal to the source current, and the source current instead of the drain current may be measured in an alternate embodiment to determine whether the memory cell is in a non/soft breakdown or a hard breakdown. In the embodiment shown in FIG. 4, when $V_g$ is at 0V, the memory cell may be regarded as being in an "on" state, whereas when Vg is at 1V, the memory cell may be regarded as being in an "off" state. In an embodiment, the gate-source voltage ($V_{gs}$), that is, the voltage across the gate and the source of the PMOS device, is approximately equal to the gate voltage ($V_g$) minus 1V.

In the embodiment shown in FIG. 4, the first gate voltage is a first predetermined gate voltage in the "read 2" condition as indicated by dashed line 402, whereas the second gate voltage is a second predetermined gate voltage in the "read 1" condition as indicated by dashed line 404. Even though the actual soft breakdown of the memory cell may occur when the gate voltage ($V_g$) is negative, as indicated by region 406 in FIG. 4, for example, the predetermined gate voltages 402 and 404 in respective "read 2" and "read 1" conditions are both positive voltages in the embodiment shown in FIG. 4.

In an embodiment, the gate voltage 402 for the "read 2" condition is at approximately 0.9V whereas the gate voltage 404 for the "read 1" condition is at approximately 0.4V as shown in FIG. 4. In FIG. 4, an exemplary forward $I_d$-$V_g$ curve 408 is plotted when the PMOS device is in the pre-program mode, that is, when the PMOS device is without charge trap, whereas an exemplary reverse $I_d$-$V_g$ curve 410 is plotted when the PMOS device is in the post-program mode, that is, when the PMOS device is indicated by the charge trap to shift Vt.

Figure 5:
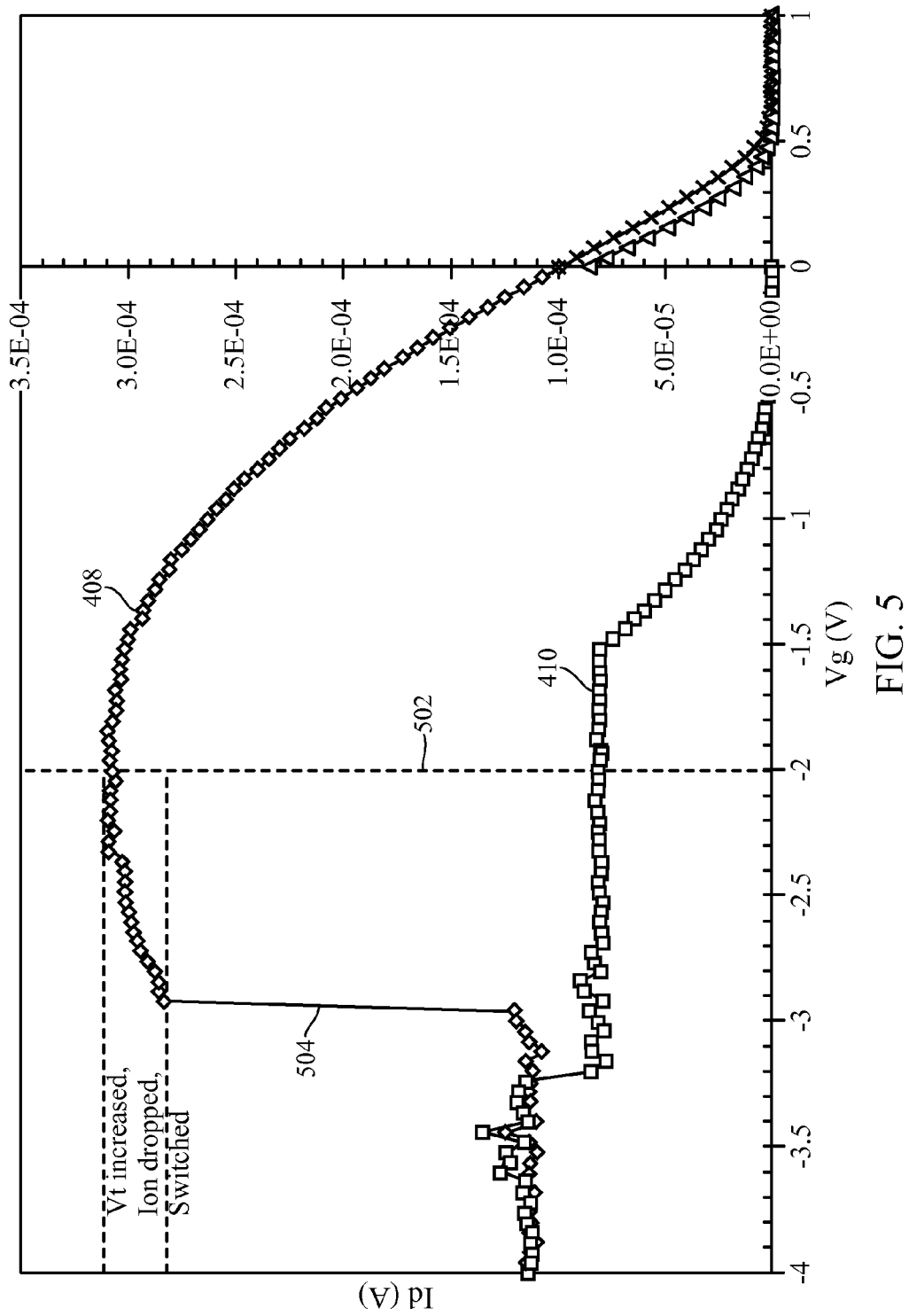
FIG. 5 is a magnified version of a portion of the $I_d$-$V_g$ graph of FIG. 4, with gate voltage ($V_g$) in the range of −4V to +1V on a linear scale and drain current ($I_d$) in the range of $5 \times 10^{-5}$ A to $3.5 \times 10^{-4}$ A on a logarithmic scale.

FIG. 5 is a magnified version of a portion of the $I_d$-$V_g$ graph of FIG. 4, with the gate voltage ($V_g$) in the range of −4V to +1V on a linear scale and the drain current ($I_d$) in the range of 0 A to $3.5 \times 10^{-3}$ A on a linear scale. In an embodiment, when the PMOS device is in a soft breakdown, the threshold voltage ($V_t$) is shifted. For example, when the gate voltage ($V_g$) decreases below −2V as indicated by dashed line 502 in FIG. 5, shifting or switching of the threshold voltage ($V_t$) may be started. When the gate voltage ($V_g$) decreases to −3V, for example, a soft breakdown may occur, as indicated by a precipitous drop in the drain current ($I_d$) along a section 504 of the $I_d$-$V_g$ curve 408 from approximately $2.8 \times 10^{-4}$ A to approximately $1 \times 10^{-4}$ A when the progressively decreasing gate voltage ($V_g$) approaches −3V, for example. Thus, in the example shown in FIG. 5, a gap of about 1V exists between the gate voltage at the switching of $V_t$ and the gate voltage when the soft breakdown occurs.

Figure 6:
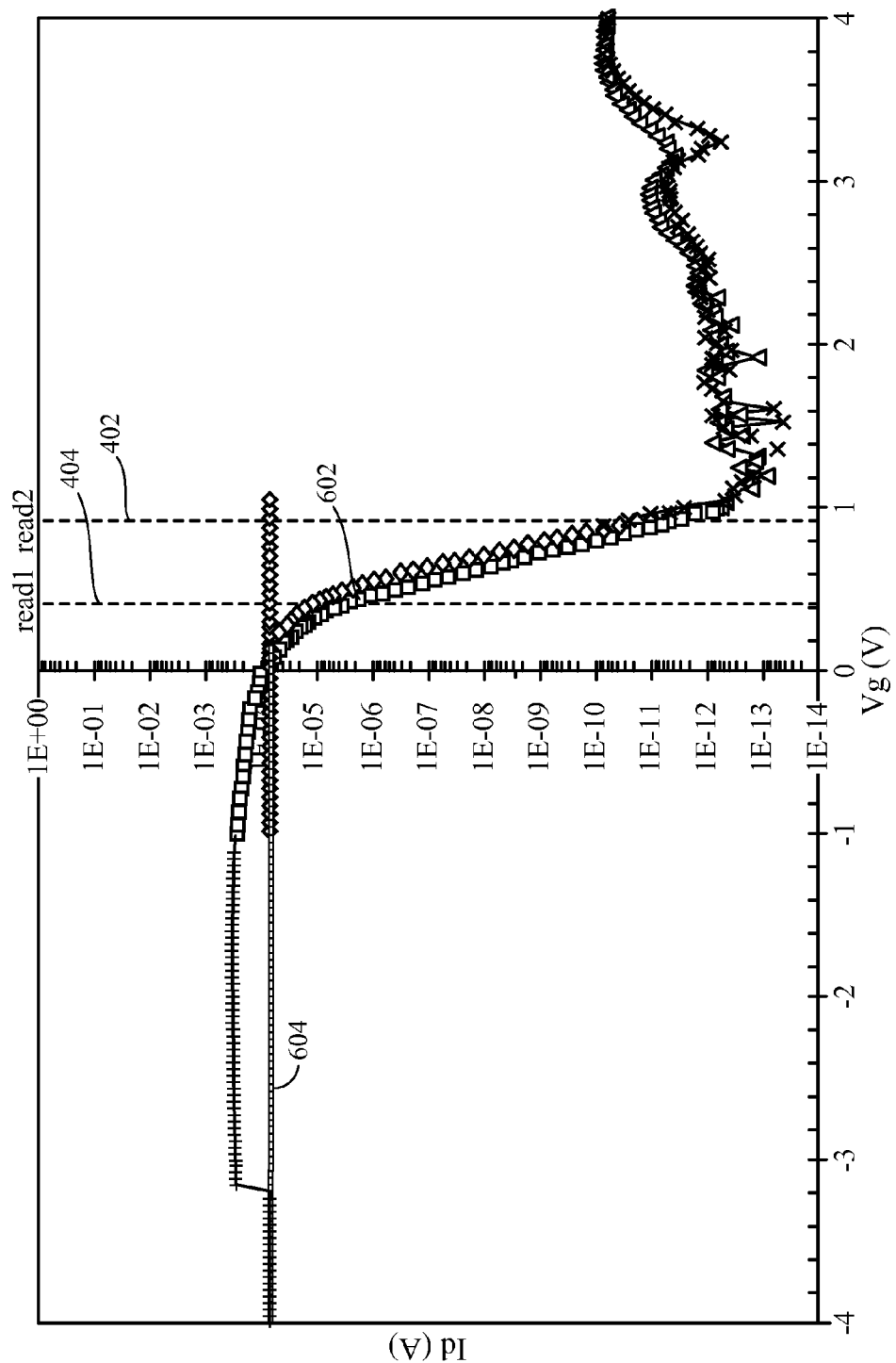
FIG. 6 is a graph illustrating an example of drain current versus gate voltage ($I_d$-$V_g$) curves in which an OTP memory cell experiences a hard breakdown.

FIG. 6 is a graph illustrating an example of drain current versus gate voltage ($I_d$-$V_g$) curves in another exemplary case in which a 16FF PMOS HK-MG OTP memory cell experiences a hard breakdown. In FIG. 6, the gate voltage ($V_g$) is in the range of −4V to +4V on a linear scale while the drain current ($I_d$) is in the range of $10^{-14}$ A to 1 A on a logarithmic scale. In FIG. 6, an exemplary forward $I_d$-$V_g$ curve 602 is plotted when the PMOS device is in the pre-program mode, that is, when the PMOS device is without charge trap, whereas an exemplary reverse $I_d$-$V_g$ curve 604 is plotted when the PMOS device is in the post-program mode, that is, when the PMOS device is has hard breakdown and gate loss control on channel.

In contrast with FIG. 4, the reverse $I_d$-$V_g$ curve 604 in FIG. 6 is substantially a horizontal line when the OTP memory cell experiences a hard breakdown, that is, when the drain current ($I_d$) is substantially constant regardless of the gate voltage ($V_g$) applied (gate loss control to channel). In addition to being substantially constant when the gate voltage ($V_g$) is in the negative region, the drain current ($I_d$) is also substantially constant when the gate voltage ($V_g$) is positive, as shown in FIG. 6. For example, when the first gate voltage ($V_g$) of approximately 0.9V is applied, that is, when the OTP memory cell is in the "read 2" condition, the drain current ($I_d$) is approximately $10^{-4}$ A, as shown in FIG. 6. When the second gate voltage ($V_g$) of approximately 0.4V is applied, that is, when the OTP memory cell is in the "read 1" condition, the drain current ($I_d$) remains substantially constant at approximately $10^{-4}$ A, as shown in FIG. 6. Under both "read 2" and "read 1" conditions, the drain current ($I_d$) is greater than the predetermined current level of 1 μA.

Figure 7:
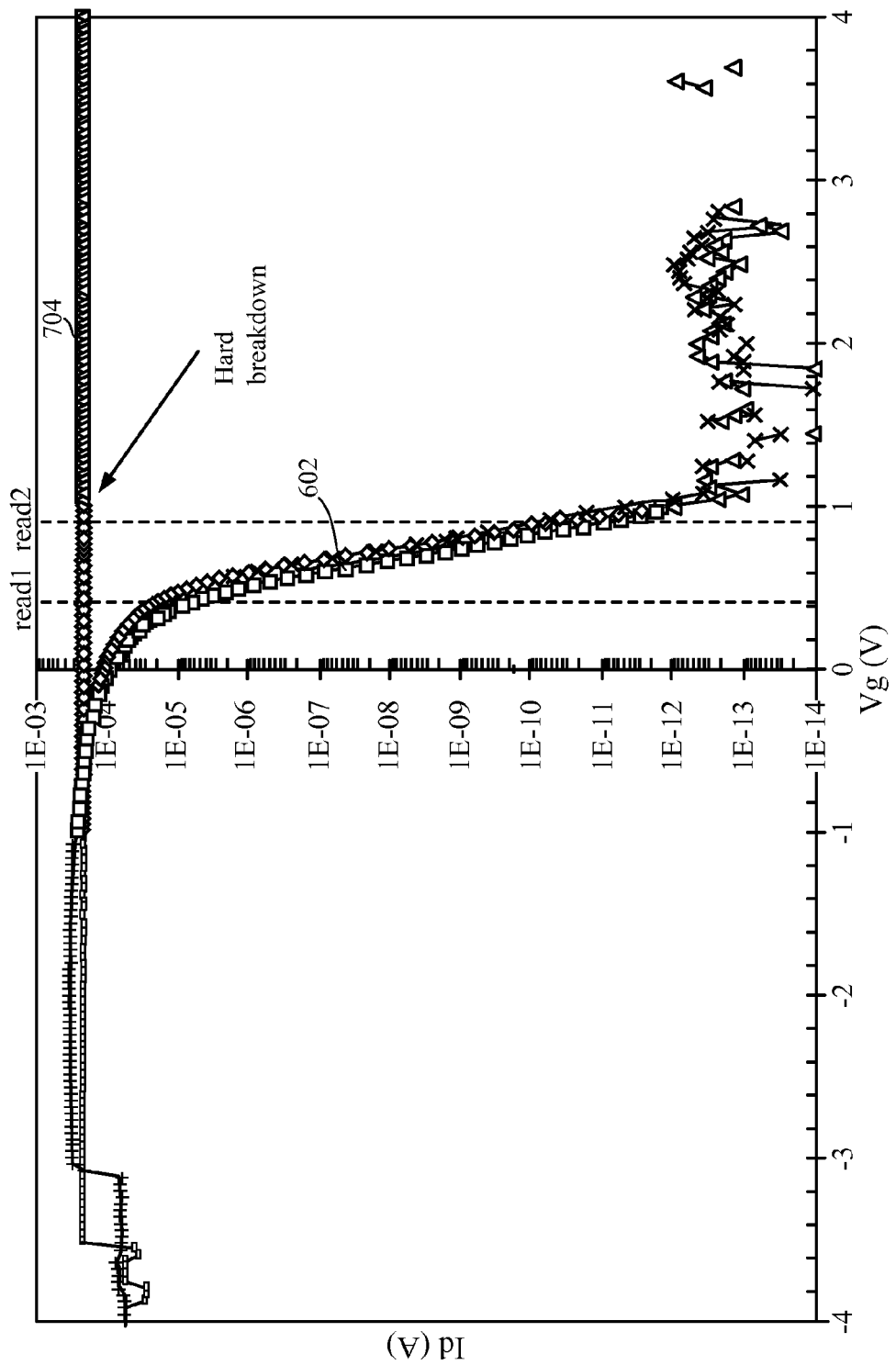
FIG. 7 is a graph illustrating another example of drain current versus gate voltage ($I_d$-$V_g$) curves in which an OTP memory cell experiences a hard breakdown.

FIG. 7 is a graph illustrating another example of drain current versus gate voltage ($I_d$-$V_g$) curves in yet another exemplary case similar to FIG. 6, but with a hard breakdown $I_d$-$V_g$ curve extending from a negative gate voltage ($V_g$) of approximately −3V to beyond a positive gate voltage ($V_g$) of approximately +4V. Again, when the first gate voltage ($V_g$) of approximately 0.9V is applied in the "read 2" condition, the drain current ($I_d$) is approximately $10^{-4}$ A as shown in FIG. 7. When the second gate voltage ($V_g$) of approximately 0.4V is applied in the "read 1" condition, the drain current ($I_d$) remains substantially constant at approximately $10^{-4}$ A, as shown in FIG. 7.

In accordance with embodiments of the disclosure, two read sensing spots at two predetermined gate voltages, that is, "read 2" and "read 1" conditions, are provided to determine whether the OTP memory cell has experienced a non/soft breakdown or a hard breakdown. With two distinct predetermined gate voltages for "read 2" and "read 1" conditions, for example, 0.9V for "read 2" and 0.4V for "read 1," both in the positive gate voltage region, an enlarged sensing window is provided. Moreover, by using two transistors per bit differential programming, the sensing window for a sense amplifier for the entire OTP memory array may be improved. Dual-voltage sensing operations according to embodiments of the disclosure may also improve the yield and reliability of OTP memory cells by improving their bake retention performance. Furthermore, no additional masks or steps in the integrated circuit fabrication process would be necessary in detecting non/soft and hard breakdowns according to embodiments of the disclosure, thereby avoiding added costs in the fabrication process.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the disclosure may include a computer readable medium embodying a method for sensing a soft breakdown and a hard breakdown in a memory cell. Accordingly, the scope of the appended claims is not limited to illustrated examples and any means for performing the functionality described herein are included in embodiments of the disclosure.

While the foregoing disclosure describes illustrative embodiments, it should be noted that various changes and modifications could be made herein without departing from the scope of the appended claims. The functions, steps or actions in the method and apparatus claims in accordance with the embodiments described herein need not be performed in any particular order unless explicitly stated otherwise. Furthermore, although elements may be described or claimed in the singular, the plural is contemplated unless limitation to the singular is explicitly stated.

What is claimed is:

1. A method of sensing a memory cell with non-breakdown or soft breakdown (non/soft breakdown) and a hard breakdown in a memory cell, the method comprising:
reading a first drain current at a first gate voltage;
comparing the first drain current to a predetermined drain current;
based upon a determination that the first drain current is greater than or equal to the predetermined drain current, outputting a reading of the first drain current; and
generating an indication that the memory cell has a hard breakdown;
based upon a determination that the first drain current is less than the predetermined drain current,
reading a second drain current at a second gate voltage;
outputting a reading of the second drain current; and
generating an indication that the memory cell has a non/soft breakdown.

2. The method of claim 1, wherein the memory cell comprises a one-time programming (OTP) memory cell.

3. The method of claim 2, wherein the OTP memory cell comprises a metal-gate (MG) OTP memory cell.

4. The method of claim 3, wherein the MG OTP memory cell comprises a high-dielectric-constant (HK) MP OTP memory cell.

5. The method of claim 2, wherein the OTP memory cell comprises a Poly/SiON OTP memory cell.

6. The method of claim 1, further comprising:
based upon the determination that the first drain current is greater than or equal to the predetermined drain current, reading a second drain current at the first gate voltage;
comparing the second drain current to the predetermined drain current; and
based upon a determination that the second drain current is greater than or equal to the predetermined drain current, outputting a reading of the second drain current.

7. The method of claim 1, further comprising:
based upon the determination that the first drain current is less than the predetermined drain current,
reading a drain current at the second gate voltage;
comparing the drain current to the predetermined drain current; and
based upon a determination that the drain current is less than the predetermined drain current, outputting a reading of the drain current which indicates shifting a threshold voltage prior to generating the indication that the memory cell has a soft breakdown.

8. The method of claim 7, further comprising applying a gate voltage of about −1 to −2V to the memory cell to start shifting the threshold voltage.

9. The method of claim 8, wherein a soft breakdown occurs at a gate voltage of about −3V.

10. The method of claim 1, wherein the predetermined drain current is about 1 μA.

11. A method for sensing a non/soft breakdown and a hard breakdown in a memory cell, the method comprising the steps for:
reading a first drain current at a first gate voltage;
comparing the first drain current to a predetermined drain current;
based upon a determination that the first drain current is greater than or equal to the predetermined drain current, performing the steps for:
outputting a reading of the first drain current; and
generating an indication that the memory cell has a hard breakdown;
based upon a determination that the first drain current is less than the predetermined drain current, performing the steps for:
reading a second drain current at a second gate voltage;
outputting a reading of the second drain current; and
generating an indication that the memory cell has a non/soft breakdown.

12. The method of claim 11, wherein the memory cell comprises a one-time programming (OTP) memory cell.

13. The method of claim 12, wherein the OTP memory cell comprises a metal-gate (MG) OTP memory cell.

14. The method of claim 13, wherein the MG OTP memory cell comprises a high-dielectric-constant (HK) MP OTP memory cell.

15. The method of claim 13, wherein the OTP memory cell comprises a Poly/SiON OTP memory cell.

16. The method of claim 11, further comprising the steps for:
based upon the determination that the first drain current is greater than or equal to the predetermined drain current, performing the steps for:
reading a second drain current at the first gate voltage;
comparing the second drain current to the predetermined drain current; and
based upon a determination that the second drain current is greater than or equal to the predetermined drain current, outputting a reading of the second drain current.

17. The method of claim 11, further comprising the steps for:
based upon the determination that the first drain current is less than the predetermined drain current, performing the step for:
reading a drain current at the second gate voltage;
comparing the drain current to the predetermined drain current; and
based upon a determination that the drain current is less than the predetermined drain current, outputting a reading of the drain current which indicates shifting a threshold voltage prior to generating the indication that the memory cell has a soft breakdown.

18. The method of claim 17, further comprising the step for applying a gate voltage of about −1 to −2V to the memory cell to start shifting the threshold voltage.

19. The method of claim 18, wherein a soft breakdown occurs at a gate voltage of about −3V.

20. The method of claim 11, wherein the predetermined drain current is about 1 μA.

21. An apparatus for sensing a one-time-programming (OTP) cell with a non-breakdown or soft breakdown (non/soft breakdown) and a hard breakdown in a memory cell, the apparatus comprising:
means for reading a first drain current at a first gate voltage;
means for comparing the first drain current to a predetermined drain current;
means for outputting a reading of the first drain current;
means for generating an indication that the memory cell has a hard breakdown based upon a determination that the first drain current is greater than or equal to the predetermined drain current;
means for reading a second drain current at a second gate voltage;
means for outputting a reading of the second drain current; and
means for generating an indication that the memory cell has a soft breakdown based upon a determination that the first drain current is less than the predetermined drain current.

22. The apparatus of claim 21, wherein the memory cell comprises a one-time programming (OTP) memory cell.

23. The apparatus of claim 22, wherein the OTP memory cell comprises a P-channel metal oxide semiconductor (PMOS) OTP memory cell.

24. The apparatus of claim 21, further comprising:
means for reading a second drain current at the first gate voltage based upon the determination that the first drain current is greater than or equal to the predetermined drain current;
means for comparing the second drain current to the predetermined drain current; and
means for outputting a reading of the second drain current based upon a determination that the second drain current is greater than or equal to the predetermined drain current.

25. The apparatus of claim 21, further comprising means for OTP cell shifting a threshold voltage prior to generating the indication that the memory cell has a soft breakdown based upon the determination that the first drain current is less than the predetermined drain current.

26. A non-transitory machine-readable storage medium encoded with instructions executable to perform operations to sense a non/soft breakdown and a hard breakdown in a memory cell, the instructions comprising instructions to:
read a first drain current at a first gate voltage;
compare the first drain current to a predetermined drain current;
based upon a determination that the first drain current is greater than or equal to the predetermined drain current, output a reading of the first drain current; and
generate an indication that the memory cell has a hard breakdown;
based upon a determination that the first drain current is less than the predetermined drain current,
read a second drain current at a second gate voltage;
output a reading of the second drain current; and
generate an indication that the memory cell has a non/soft breakdown.

27. The non-transitory machine-readable storage medium of claim 26, wherein the memory cell comprises a one-time programming (OTP) memory cell.

28. The non-transitory machine-readable storage medium of claim 26, wherein the OTP memory cell comprises a P-channel metal oxide semiconductor (PMOS) OTP memory cell.

29. The non-transitory machine-readable storage medium of claim 28, wherein the instructions further comprise instructions to:
based upon the determination that the first drain current is greater than or equal to the predetermined drain current, read a second drain current at the first gate voltage;
compare the second drain current to the predetermined drain current; and
based upon a determination that the second drain current is greater than or equal to the predetermined drain current, output a reading of the second drain current.

30. The non-transitory machine-readable storage medium of claim 26, wherein the instructions further comprise instructions to:
based upon the determination that the first drain current is less than the predetermined drain current,
read a drain current at the second gate voltage;
compare the drain current to the predetermined drain current; and
based upon a determination that the drain current is less than the predetermined drain current, output a reading of the drain current which indicates shifting a threshold voltage prior to generating the indication that the memory cell has a soft breakdown.

* * * * *